(12) United States Patent
Zhou et al.

(10) Patent No.: US 9,349,873 B1
(45) Date of Patent: May 24, 2016

(54) OXIDE SEMICONDUCTOR DEVICE AND METHOD OF FABRICATING THE SAME

(71) Applicant: United Microelectronics Corp., Hsinchu (TW)

(72) Inventors: Zhi-Biao Zhou, Singapore (SG); Shao-Hui Wu, Singapore (SG); Chi-Fa Ku, Kaohsiung (TW); Chen-Bin Lin, Taipei (TW); Chun-Yuan Wu, Yunlin County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/825,511

(22) Filed: Aug. 13, 2015

(30) Foreign Application Priority Data

Jul. 8, 2015 (TW) .............................. 104122106 A

(51) Int. Cl.
| | |
|---|---|
| *H01L 21/441* | (2006.01) |
| *H01L 29/786* | (2006.01) |
| *H01L 29/66* | (2006.01) |
| *H01L 29/417* | (2006.01) |
| *H01L 29/423* | (2006.01) |
| *H01L 21/768* | (2006.01) |
| *H01L 29/24* | (2006.01) |

(52) U.S. Cl.
CPC .......... *H01L 29/7869* (2013.01); *H01L 21/441* (2013.01); *H01L 21/76841* (2013.01); *H01L 29/24* (2013.01); *H01L 29/41733* (2013.01); *H01L 29/42384* (2013.01); *H01L 29/66969* (2013.01); *H01L 29/78606* (2013.01)

(58) Field of Classification Search
CPC ................ H01L 29/7869; H01L 29/24; H01L 29/78606; H01L 29/66969; H01L 29/42384; H01L 29/41733; H01L 21/76841; H01L 21/441

See application file for complete search history.

(56) References Cited

U.S. PATENT DOCUMENTS

| | | | |
|---|---|---|---|
| 7,365,009 B2 * | 4/2008 | Chou ................ | H01L 21/76802 257/E21.058 |
| 8,525,172 B2 | 9/2013 | Hirano et al. | |
| 8,582,349 B2 | 11/2013 | Yamazaki et al. | |
| 2013/0314074 A1 * | 11/2013 | Takahashi ................ | G01R 1/36 324/110 |

* cited by examiner

*Primary Examiner* — Selim Ahmed

(74) *Attorney, Agent, or Firm* — J.C. Patents

(57) ABSTRACT

Provided is an oxide semiconductor device. A source, a drain, and a first gate are buried in a first dielectric layer, and the first gate is located between the source and the drain. A first barrier layer is located on the first dielectric layer, partially overlaps the source and the drain and overlaps the first gate. The first barrier layer includes a first opening and a second opening respectively corresponds to the source and the drain. An oxide semiconductor layer covers the first barrier layer and fills in the first opening and the second opening. A second barrier layer is located on the oxide semiconductor layer. A second gate is located on the second barrier layer and overlaps with the source, the drain, and the first gate.

20 Claims, 14 Drawing Sheets

OXIDE SEMICONDUCTOR DEVICE AND METHOD OF FABRICATING THE SAME

CROSS-REFERENCE TO RELATED APPLICATION

This application claims the priority benefit of Taiwan application serial no. 104122106, filed on Jul. 8, 2015. The entirety of the above-mentioned patent application is hereby incorporated by reference herein and made a part of this specification.

BACKGROUND OF THE INVENTION

1. Field of the Invention

The invention relates to a semiconductor device and a method for fabricating the same, and particularly relates to an oxide semiconductor device and a method for fabricating the same.

2. Description of Related Art

Recently, since an oxide semiconductor (OS) device has higher carrier mobility, a more stable threshold voltage (Vth), and suitable for large-area fabrication compared to the traditional amorphous silicon (a-Si), the oxide semiconductor device has been already applied to the display plates generally.

However, in a fabrication of the traditional oxide semiconductor device, a source and a drain are usually formed first, and then a conductive material is filled in a space between the source and the drain to form a gate, and forming a multi-layer oxide semiconductor layer is needed. Therefore, steps of fabrication are complicated. Besides, since a depth of the space is deeper between the source and the drain, the conductive material as the gate is not filled therein easily. Thus, voids or holes are easily generated in the fabrication to influence the performance of the device.

SUMMARY OF THE INVENTION

An oxide semiconductor device and a method of fabricating the same are provided. The process may be simplified, and the performance of the devices is improved.

An oxide semiconductor device including a source, a drain, a first gate, a first barrier layer, an oxide semiconductor layer, a second barrier layer, and a second gate of the invention is provided. The source, the drain, and the first gate are buried in a first dielectric layer, and the first gate is located between the source and the drain. The first barrier layer is located on the first dielectric layer, partially overlaps the source and the drain and overlaps the first gate, and the first barrier layer includes a first opening and a second opening respectively corresponding to the source and the drain. The oxide semiconductor layer covers the first barrier layer and fills in the first opening and the second opening. The second barrier layer is located on the oxide semiconductor layer. The second gate is located on the second barrier layer and overlaps with the source, the drain, and the first gate.

According to an embodiment of the invention, the source is contacted with the oxide semiconductor layer, and the drain is contacted with the oxide semiconductor layer.

According to an embodiment of the invention, the oxide semiconductor device further includes a third barrier layer located between the source and the oxide semiconductor layer and between the drain and the oxide semiconductor layer.

According to an embodiment of the invention, the second barrier layer further covers sidewalls of the oxide semiconductor layer.

According to an embodiment of the invention, the oxide semiconductor device further includes a second dielectric layer located between the second gate and the second barrier layer.

According to an embodiment of the invention, the first dielectric layer is an inner-layer dielectric layer (ILD layer), and the second dielectric layer is an inter-metal dielectric layer (IMD layer).

According to an embodiment of the invention, the first dielectric layer is an inter-metal dielectric layer, and the second dielectric layer is another inter-metal dielectric layer.

According to an embodiment of the invention, the first dielectric layer is an inner-layer dielectric layer or an inter-metal dielectric layer.

According to an embodiment of the invention, the oxide semiconductor device further includes a fourth barrier layer covering a top surface and sidewalls of the second gate, and sidewalls of the second barrier layer and the oxide semiconductor layer.

According to an embodiment of the invention, a height of the source, a height of the drain, and a height of the first gate are the same.

A method of fabricating the oxide semiconductor device including burying a source, a drain, and a first gate in a first dielectric layer. The first gate is located between the source and the drain of the invention is also provided. A first barrier material layer covering the first dielectric layer, the source, the drain, and the first gate is formed. The first barrier material layer is patterned, so as to form a first barrier layer including a first opening and a second opening respectively corresponding to the source and the drain. An oxide semiconductor layer is formed to cover the first barrier layer and fill in the first opening and the second opening. A second barrier layer is formed on the oxide semiconductor layer. A second gate is formed on the second barrier layer, and the second gate overlaps the source, the drain, and the first gate.

According to an embodiment of the invention, the method of fabricating the oxide semiconductor device further includes forming an oxide semiconductor material layer on the first barrier layer and filling in the first opening and the second opening. A second barrier material layer is formed on the oxide semiconductor material layer. A conductive material layer is formed on the second barrier material layer. The conductive material layer, the second barrier material layer, and the oxide semiconductor material layer are patterned, so as to form the second gate, the second barrier layer, and the oxide semiconductor layer.

According to an embodiment of the invention, the method of fabricating the oxide semiconductor device further includes forming a third barrier layer covering the source, the drain, and the first gate after burying the source, the drain, and the first gate in the first dielectric layer and before forming the first barrier layer.

According to an embodiment of the invention, the method of fabricating the oxide semiconductor device further includes forming the oxide semiconductor material layer on the first barrier layer and filling in the first opening and the second opening. The oxide semiconductor material layer is patterned, so as to form the oxide semiconductor layer. The second barrier layer is formed, and the second barrier layer covers the oxide semiconductor layer and the first barrier layer. A second dielectric layer is formed to cover the second barrier layer. A plurality of opening is formed in the second dielectric layer. A conductive material layer is formed on the second barrier layer. The conductive material layer on the second dielectric layer is removed, so as to form the second gate.

According to an embodiment of the invention, the source, the drain, and the first gate are formed simultaneously.

According to an embodiment of the invention, the method of fabricating the oxide semiconductor device further includes rounding top edge corners of the first opening and the second opening.

According to an embodiment of the invention, an aspect ratio of the first opening and the second opening is less than 1.

According to an embodiment of the invention, a material of the first barrier layer and a material of the second barrier layer respectively includes hafnium aluminum oxide, aluminum oxide ($Al_2O_3$), hafnium oxide ($HfO_2$), silicon nitride, zirconium oxide ($ZrO_x$), silicon oxide ($SiO_x$), or a combination thereof.

According to an embodiment of the invention, a material of the oxide semiconductor layer includes IGZO, ZnO, CdO, $SnO_2$, $In_2O_3$, $TiO_2$, SnO, $Cu_2O$, NiO, CoO, $FeO_x$, $Cr_2O_3$, or a combination thereof.

According to an embodiment of the invention, the first dielectric layer is an inner-layer dielectric layer or an inter-metal dielectric layer.

In summary, since the source, the drain, and the first gate are formed simultaneously, and the oxide semiconductor layer may be formed only once of the invention, the method may reduce the steps of the process and improve the critical dimension of the device. Besides, since the first barrier layer (gate dielectric layer) is thin and a depth of the openings is shallow formed by patterning, such that the oxide semiconductor layer formed subsequently is easily to fill in the openings to improve the performance of the device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are schematic cross-sectional views illustrating a method of fabricating an oxide semiconductor device according to a first exemplary embodiment of a first embodiment of the invention. FIG. 1F is a schematic cross-sectional view illustrating an oxide semiconductor device according to a second exemplary embodiment of the first embodiment of the invention. FIG. 1G is a schematic cross-sectional view illustrating an oxide semiconductor device according to a third exemplary embodiment of the first embodiment of the invention.

Figure 1A:
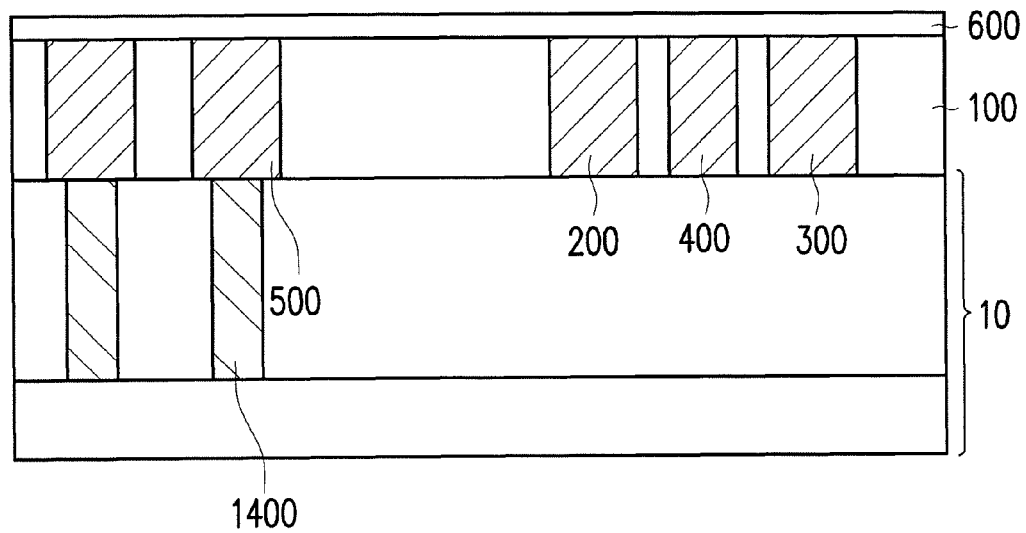
FIG. 1A to FIG. 1E are schematic cross-sectional views illustrating a method of fabricating an oxide semiconductor device according to a first exemplary embodiment of a first embodiment of the invention.

Referring to FIG. 1A, a substrate 10 is provided. The substrate 10 may be a semiconductor substrate, glass, quartz, an organic polymer, an opaque/reflection material (e.g., conductive materials, metal, wafer, ceramic, or other suitable materials), or other suitable material. The semiconductor substrate is formed of silicon or a semiconductor compound (e.g., gallium arsenide), for example. In some embodiments, an integrated circuit device may have been formed on the substrate 10. The integrated circuit device is a metal-oxide-semiconductor field-effect transistor (MOSFET) device, for example. In some embodiments, an integrated circuit device and a dielectric layer may have been formed on the substrate 10. The dielectric layer is formed of silicon oxide, silicon nitride, silicon oxynitride, or a combination thereof, for example. The dielectric layer may be an inner-layer dielectric layer or an inter-metal dielectric layer. Metal interconnections 1400 may be formed in the dielectric layer. The metal interconnections 1400 are a plurality of contact plugs, for example. The contact plugs are electrically connected with the integrated circuit device.

Afterwards, a first dielectric layer 100, a source 200, a drain 300, and a first gate 400 are formed on the substrate 10. The source 200, the drain 300, and the first gate 400 are buried in the first dielectric layer 100. The first gate 400 is located between the source 200 and the drain 300. Other structures may be buried in the first dielectric layer 100 simultaneously, such as conductive structures 500. The conductive structures 500 may be electrically connected with the integrated circuit device on the substrate 10 via the metal interconnections 1400. The conductive structures 500 may be contact plugs, via plugs, metal lines, bit lines, or word lines.

In some embodiments, the first dielectric layer 100 is an inter-metal dielectric layer. In some other embodiments, the first dielectric layer 100 may be an inner-layer dielectric layer. The first dielectric layer 100 may be formed of an organic dielectric material, an inorganic dielectric material, or a combination thereof. A material of the first dielectric layer 100 is silicon oxide, silicon nitride, silicon oxynitride, silicon carbide, silicon oxycarbide, silicon carbonitride, silicon carbon oxynitirde, un-doped silicon glass (USG), borophosphosilicate glass (BPSG), phosphosilicate glass (PSG), a low dielectric constant material, or a combination thereof, for example. The low dielectric constant material is a material layer having a dielectric constant smaller than 4, such as fluorine doped silicate glass (FSG) or porous polymer, etc. A method of forming the first dielectric layer 100 may be plasma enhance chemical vapor deposition (PECVD), sub-atmosphere chemical vapor deposition, high aspect ratio process (HARP), high-temperature thermal oxidation process, low-pressure chemical vapor deposition, high-density plasma chemical vapor deposition (HDPCVD), etc. The source 200, the drain 300, the first gate 400, and the conductive structures 500 may be formed simultaneously. The source 200, the drain 300, the first gate 400, and the conductive structures 500 are formed of a conductive material. The conductive material includes metal, alloy, metal silicide, metal nitride, etc. The conductive material includes, but not limited thereto, aluminum (Al), copper (Cu), tungsten (W), titanium (Ti), tantalum (Ta), titanium aluminide (TiAl), titanium silicide (TiSi), titanium nitride (TiN), tantalum nitride (TaN), polysilicon, or a combination thereof, for example. A forming method includes deposition techniques, such as atomic layer deposition (ALD), physical vapor deposition (PVD), or chemical vapor deposition (CVD), etc.

The first dielectric layer 100, the source 200, the drain 300, the first gate 400, and the conductive structures 500 may be formed using various processes. In some exemplary embodiments, the first dielectric layer 100 may be formed on the substrate 10 first. The first dielectric layer 100 may be planarized to have a planarized surface. A planarizaiton may be performed by a chemical mechanical polishing (CMP) process. Then, a lithography process and an etching process are performed, so as to form a plurality of openings (not shown) in the first dielectric layer 100. Afterwards, a conductive material is formed on the first dielectric layer 100 and in the openings. After that, the conductive material on the first dielectric layer 100 is removed by performing a chemical mechanical polishing process or an etching-back process, so as to form the source 200, the drain 300, the first gate 400, and the conductive structures 500 in the first dielectric layer 100.

In some other exemplary embodiments, the source 200, the drain 300, the first gate 400, and the conductive structures 500 may be formed first, and then the first dielectric layer 100 is formed. Specifically, a conductive material layer is foil led on the substrate 10 first. Then, the conductive material layer is patterned by performing a lithography process and an etching process, so as to form the source 200, the drain 300, the first gate 400, and the conductive structures 500. Next, a dielectric material layer is formed on the source 200, the drain 300, the first gate 400, and the conductive structures 500 and in spaces from each other where therebetween. After that, the dielectric material layer on the source 200, the drain 300, the first gate 400, and the conductive structures 500 is removed by a chemical mechanical polishing process or an etching-back process to form the first dielectric layer 100.

Next, continuing referring to FIG. 1A, a first barrier material layer 600 is formed on the first dielectric layer 100. A material of the first barrier material layer 600 includes hafnium aluminum oxide, aluminum oxide ($Al_2O_3$), hafnium oxide ($HfO_2$), silicon nitride, zirconium oxide ($ZrO_x$), silicon oxide ($SiO_x$), other similar dielectric materials, or a combination thereof, wherein x represents as any possible stoichiometric values. A thickness of the first barrier material layer 600 is from 5 nm to 100 nm, for example. A method of forming the first barrier material layer 600 includes ALD, CVD, or PVD. A first annealing process may be performed before the first barrier material layer 600 is formed, so as to exhaust gases, such as $H_2O$ and $H_2$, to prevent unfavorable effects may be produced during the fabrication of the devices. The temperature of the first annealing process is from 200° C. to 500° C., for example. In an exemplary embodiment, the temperature of the first annealing process is about 410° C.

Figure 1B:
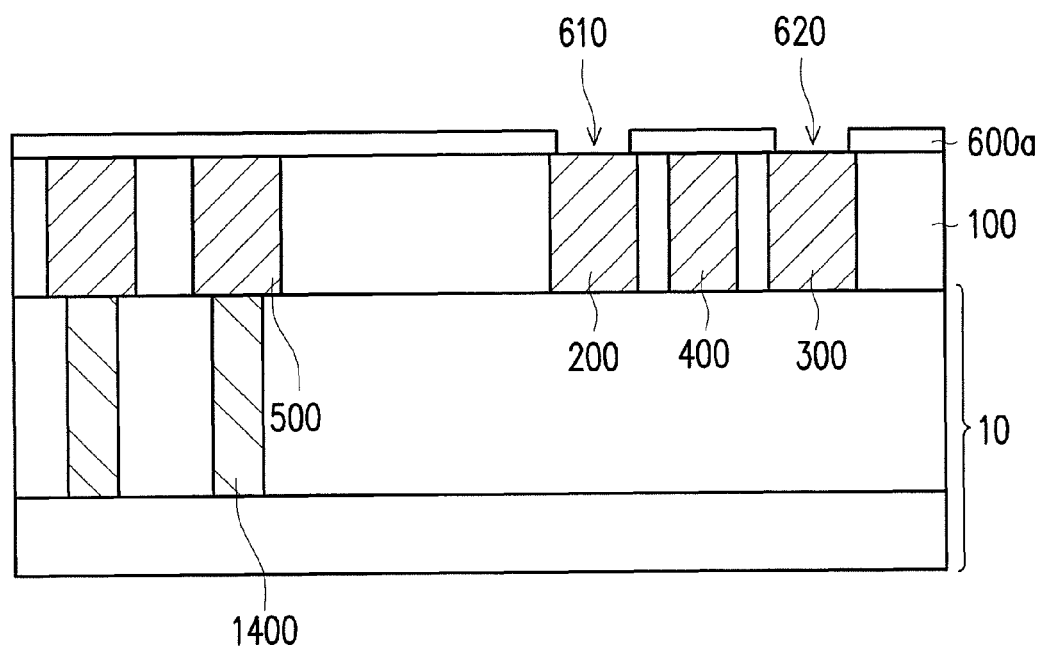

Next, referring to FIG. 1A and FIG. 1B, the first barrier material layer 600 is patterned by a lithography process and an etching process, so as to form the first barrier layer 600a. The first barrier layer 600a has a first opening 610 and a second opening 620 exposing the source 200 and the drain 300 respectively. An aspect ratio of the first opening 610 and the second opening 620 is smaller than 1, for example. In an embodiment, top edge corners of the first opening 610 and the second opening 620 may have an arc-like structure or a tilt angle. In an exemplary embodiment, the top edge corners of the first opening 610 and the second opening 620 having the arc-like structure or the tilt angle may be formed by an ion bombardment in the process of etching the first barrier material layer 600.

Figure 1C:
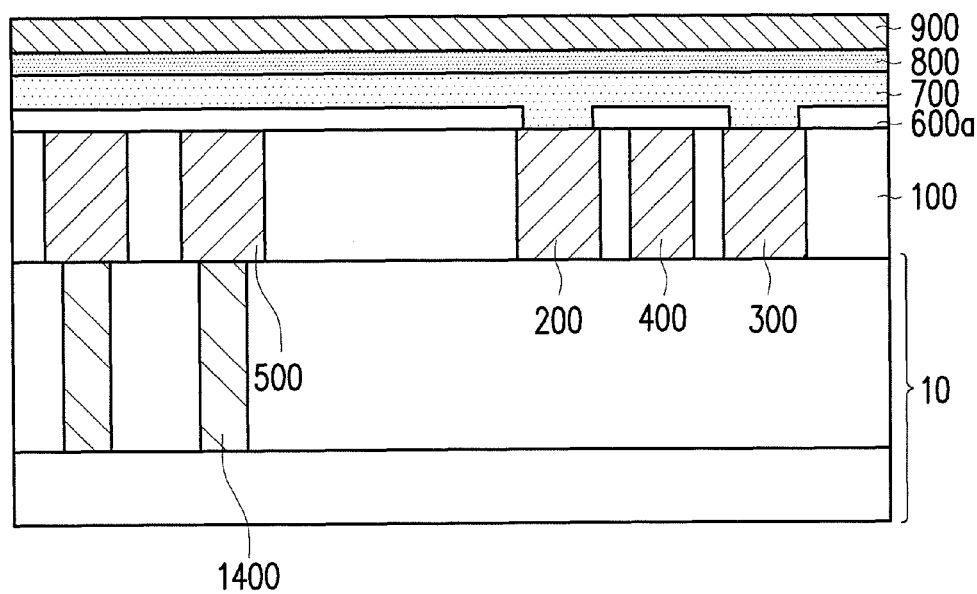

After that, referring to FIG. 1C, an oxide semiconductor material layer 700 is formed on the substrate 10. In some embodiments, the oxide semiconductor material layer 700 is formed on the first barrier layer 600a and filled in the first opening 610 and the second opening 620 contacting with the source 200 and the drain 300. A material of the oxide semiconductor material layer 700 includes indium gallium zinc oxide (IGZO), ZnO, CdO, $SnO_2$, $In_2O_3$, $TiO_2$, SnO, $Cu_2O$, NiO, CoO, $FeO_x$, $Cr_2O_3$, or a combination thereof, wherein x represents any possible stoichiometric values. In some embodiments, the material of the oxide semiconductor material layer 700 includes a c-axis aligned crystalline (CAAC) material, such as CAAC-IGZO. In some embodiments, a thickness of the oxide semiconductor material layer 700 is from 100 nm to 500 nm, for example. In some other embodiments, the size of a device is gradually reduced as the semiconductor process is developed, and the thickness of the oxide semiconductor material layer 700 may become thinner. A method of forming the oxide semiconductor material layer 700 includes PVD, such as sputtering. The sputtering may be performed using the target containing four elements including oxygen, indium, gallium, and zinc, or the sputtering may be performed using the target containing three elements including indium, gallium, and zinc in an oxygen-containing environment, or the co-sputtering may be performed using the target respectively containing indium oxide, gallium oxide, zinc oxide, etc. In some embodiments, the target of PVD may includes $In_xGa_yZn_zO_4$ target, wherein a ratio of x:y:z may be 1:1:1. People of ordinary skill in the art may understand that the target of PVD with other constituents may be used. Since the thickness of the first barrier layer 600a is quite thin and the aspect ratio of the first opening 610 and the second opening 620 is small, the oxide semiconductor material layer 700 is easily filled in the first opening 610 and the second opening 620. In some embodiments, the top edge corners of the first opening 610 and the second opening 620 having an arc-like structure or a tilt angle are useful for filling with the oxide semiconductor material layer 700 therein.

Afterwards, a second barrier material layer 800 and a conductive material layer 900 are foil led on the oxide semiconductor material layer 700. A material of the second barrier material layer 800 includes hafnium aluminum oxide, aluminum oxide ($Al_2O_3$), hafnium oxide ($HfO_2$), silicon nitride, zirconium oxide ($ZrO_x$), silicon oxide ($SiO_x$), silicon oxide/silicon nitride/silicon oxide (ONO), other similar dielectric materials, or a combination thereof, wherein x represents as any possible stoichiometric values. In an embodiment, a thickness of the second barrier material layer 800 is from 100 nm to 500 nm, for example. In another embodiment, the thickness of the second barrier material layer 800 is from 5 nm to 100 nm, for example. A method of forming the second barrier material layer 800 includes ALD, PVD, or CVD. A material of the conductive material layer 900 may be metal, metal alloy, metal nitride, such as TiN, TaN, W, Al, other similar conductive material, or a combination thereof. A thickness of the conductive material layer 900 is from 100 nm to 500 nm, for example. A method of forming the conductive material layer 900 includes PVD (e.g., sputtering), or CVD.

Figure 1D:
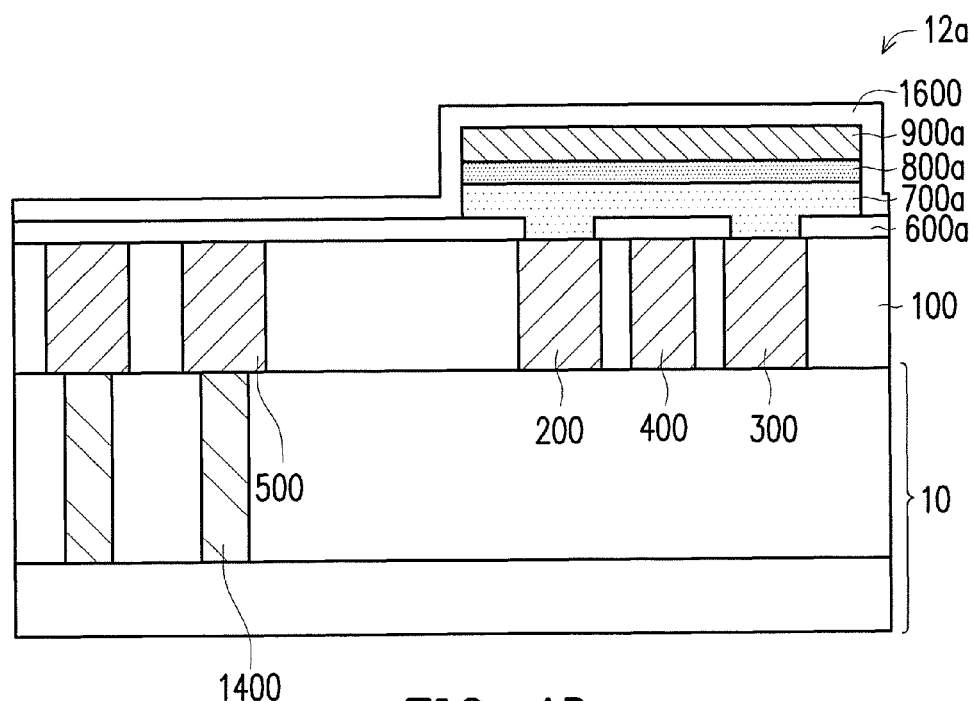

After that, referring to FIG. 1C and FIG. 1D, the oxide semiconductor material layer 700, the second barrier material layer 800, and the conductive material layer 900 are patterned, so as to form an oxide semiconductor layer 700a, a second barrier layer 800a, and a second gate 900a. A method of patterning the oxide semiconductor material layer 700, the second barrier material layer 800, and the conductive material layer 900 includes a lithography process and an etching process. The etching process is a dry etching process, for example. The source 200, the drain 300, the first gate 400, the first barrier layer 600a, the oxide semiconductor layer 700a, the second barrier layer 800a, and the second gate 900a may be formed as an oxide semiconductor device 12a. The oxide semiconductor layer 700a is formed as a channel region of the oxide semiconductor device 12a.

In some embodiments, a fourth barrier layer 1600 may be formed on the substrate 10 optionally to cover the oxide semiconductor layer 700a, the second barrier layer 800a, the second gate 900a, and the first barrier layer 600a after the oxide semiconductor layer 700a, the second barrier layer 800a, and the second gate 900a are formed by patterning. A material of the fourth barrier layer 1600 is, for example, hafnium aluminum oxide, aluminum oxide ($Al_2O_3$), hafnium oxide ($HfO_2$), silicon nitride, zirconium oxide ($ZrO_x$), silicon oxide ($SiO_x$), other similar dielectric materials, or a combination thereof, wherein x represents as any possible stoichiometric values. In an embodiment, a thickness of the fourth barrier layer 1600 is from 100 nm to 500 nm, for example. In another embodiment, the thickness of the fourth barrier layer 1600 is from 5 nm to 100 nm, for example. A method of forming the fourth barrier layer 1600 includes ALD, PVD, or CVD. In some embodiments, a second annealing process may be performed after the fourth barrier layer 1600 is formed, so as to exhaust gases, such as $H_2O$ and $H_2$, to prevent unfavorable effects may be produced during the subsequent fabrication of the devices. The temperature of the second annealing process may be from 200° C. to 400° C., for example.

Figure 1E:
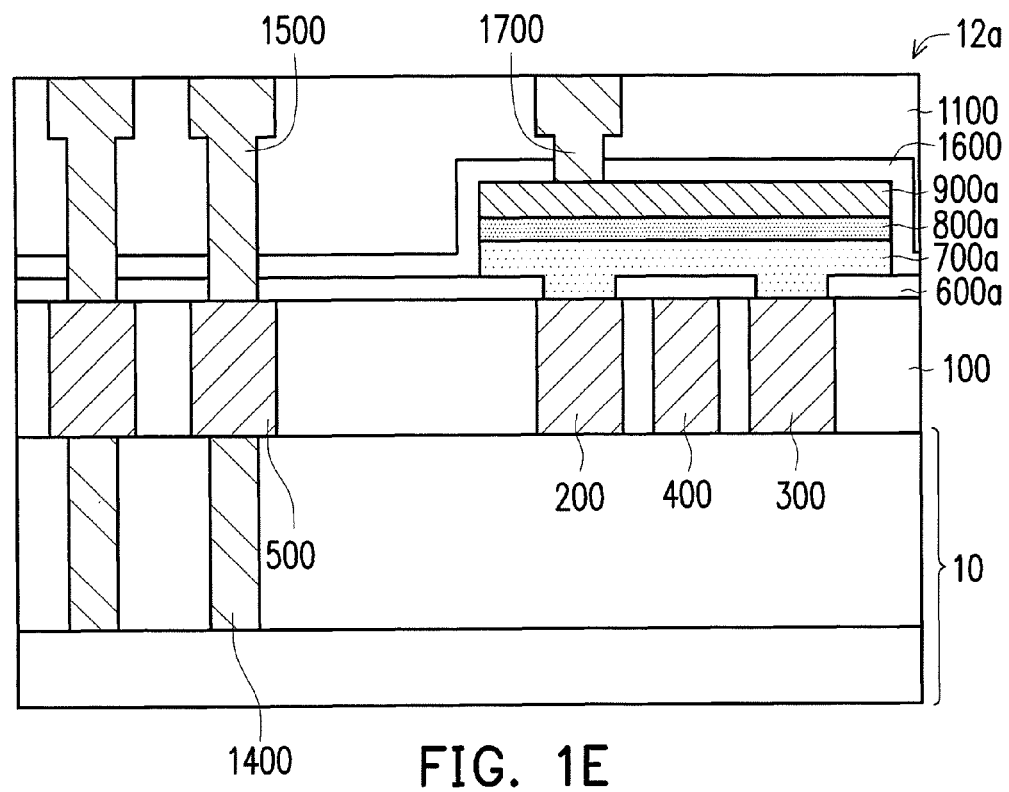
Figure 1F:
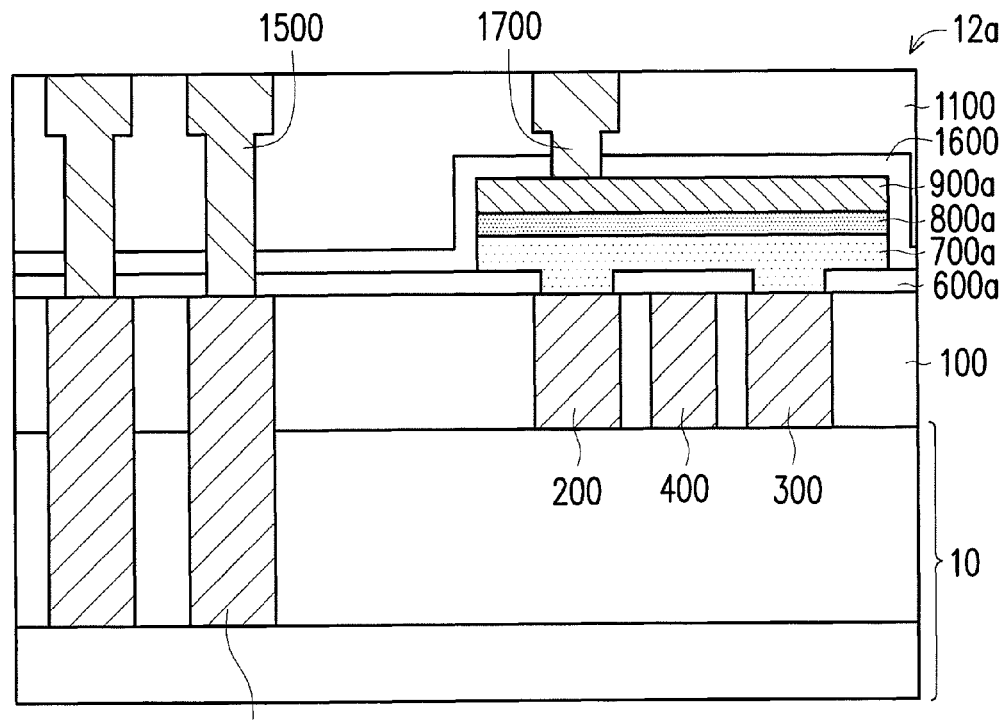
FIG. 1F is a schematic cross-sectional view illustrating an oxide semiconductor device according to a second exemplary embodiment of the first embodiment of the invention.
Figure 1G:
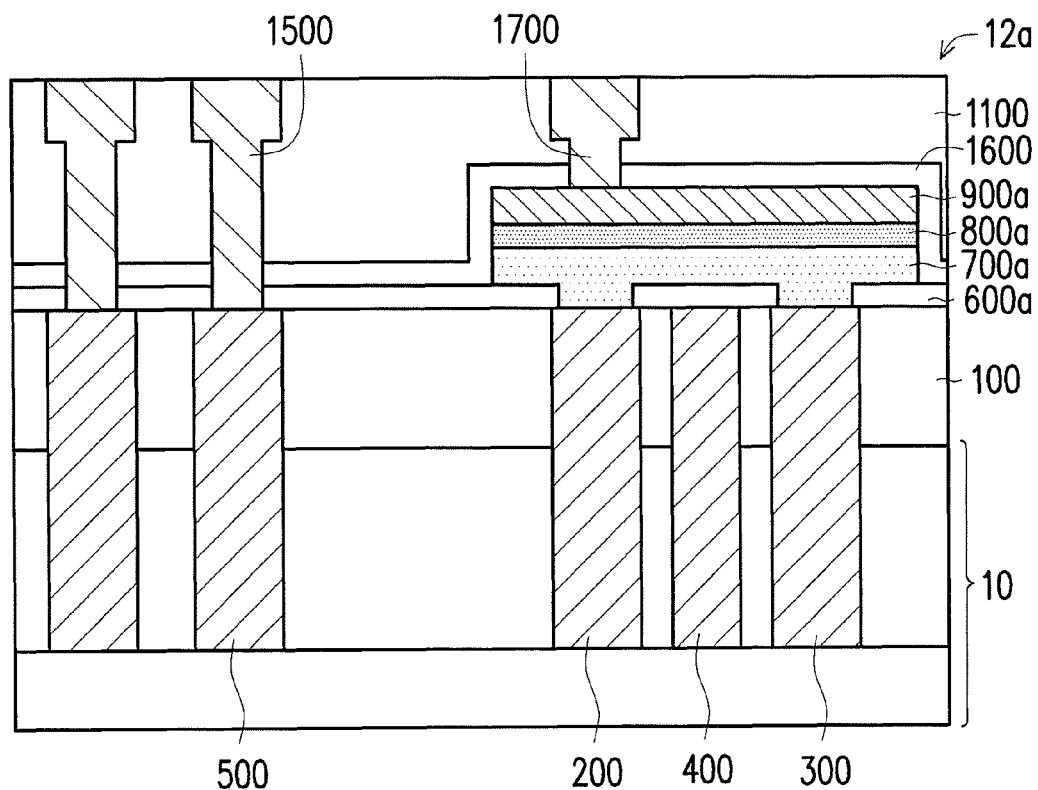
FIG. 1G is a schematic cross-sectional view illustrating an oxide semiconductor device according to a third exemplary embodiment of the first embodiment of the invention.

Referring to FIG. 1E, after the fourth barrier layer 1600 is formed, a dielectric layer 1100 may be formed, and a metal interconnection 1500 and a metal interconnection 1700 are formed in the dielectric layer 1100. The metal interconnection 1500 is connected with the conductive structures 500; and the metal interconnection 1700 is electrically connected with the second gate 900a of the oxide semiconductor device 12a.

Referring to FIG. 1E, in a first exemplary embodiment, the conductive structures 500 is a Mth metal layer of the metal interconnection structure; and the source 200, the drain 300, the first gate 400, and the conductive structures 500 of the oxide semiconductor device 12a are formed simultaneously with the Mth metal layer of the metal interconnection structure. The metal interconnection 1500 connecting with the conductive structures 500 is a first via plug connecting with the Mth metal layer and the (M+1)th metal layer; and the metal interconnection 1700 connecting with the second gate 900a of the oxide semiconductor device 12a is a second via plug. The second via plug may be formed with the first via plug simultaneously.

Referring to FIG. 1F, in a second exemplary embodiment, a height of a top surface of the source 200, the drain 300, the first gate 400, and the conductive structures 500 of the oxide semiconductor device 12a is approximately the same as a height of a top surface of one of the contact plug or the via plug of the metal interconnection structure. In other words, in exemplary embodiments, the conductive structures 500, which are contact plugs or via plugs, may be extended directly to contact with the substrate 10 without the metal interconnection 1400 as shown in FIG. 1E. The source 200, the drain 300, the first gate 400, and the conductive structures 500 may be formed with the conductive structures 500 in approximately the same stage. However, a length of the conductive structures 500 is longer, while a length of the source 200, the drain 300, and the first gate 400 is shorter. In an embodiment, the conductive structures 500 may pass through the dielectric layer in the substrate 10 and contact with the integrated circuit device directly; while the source 200, the drain 300, and the first gate 400 may not pass through the dielectric layer in the substrate 10 and not contact with the integrated circuit device directly.

Referring to FIG. 1G, in a third exemplary embodiment, the conductive structures 500 are also contact plugs or via plugs, and the source 200, the drain 300, the first gate 400, and the conductive structures 500 may be formed with the conductive structures 500 in approximately the same stage. Besides, a length of the source 200, the drain 300, and the first gate 400 is approximately the same as a length of the conductive structures 500 that bottom is contacted with the substrate 10; and a height of the source 200, the drain 300, and the first gate 400 is approximately the same as a height of the conductive structures 500 that bottom is also contacted with the integrated circuit device in the substrate 10.

Figure 1H:
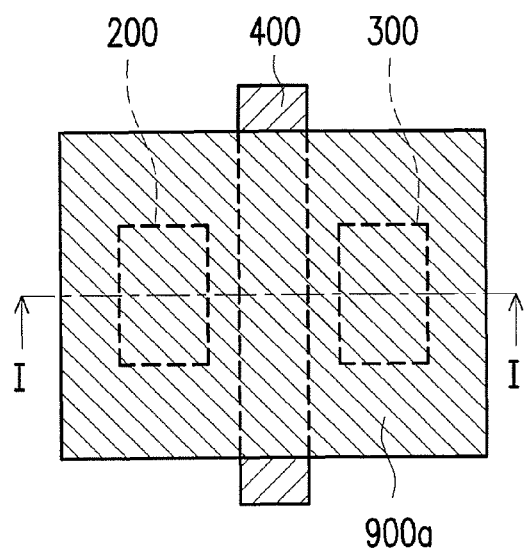
FIG. 1H is a top view illustrating an oxide semiconductor device according to the first embodiment of the invention.

FIG. 1H is a top view illustrating an oxide semiconductor device according to the first embodiment of the invention. A vertical section of a line I-I in FIG. 1H may be the oxide semiconductor device shown in FIG. 1E, FIG. 1F, or FIG. 1G.

Referring to FIG. 1D and FIG. 1H, in a first embodiment, the oxide semiconductor device 12a includes the source 200, the drain 300, the first gate 400, the first barrier layer 600a, the oxide semiconductor layer 700a, the second barrier layer 800a, and the second gate 900a. The source 200, the drain 300, and the first gate 400 are buried in the first dielectric layer 100. The first gate 400 is located between the source 200 and the drain 300 (along the line I-I in FIG. 1I). The first barrier layer 600a is located on the first dielectric layer 100, partially overlaps the source 200 and the drain 300 and overlaps the first gate 400, and the first barrier layer 600a includes the first opening 610 and the second opening 620 respectively corresponding to the source 200 and the drain 300. The oxide semiconductor layer 700a covers the first barrier layer 600a and fills in the first opening 610 and the second opening 620. The second barrier layer 800a is located on the oxide semiconductor layer 700a. The second gate 900a is located on the second barrier layer 800a and overlaps with the source 200, the drain 300, and the first gate 400.

Figure 2A:
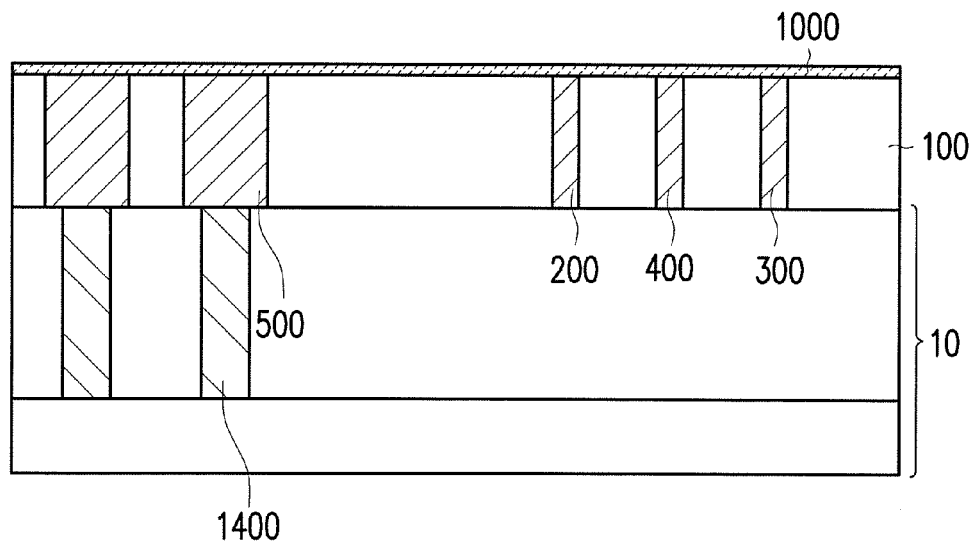
FIG. 2A to FIG. 2E are schematic cross-sectional views illustrating a method of fabricating an oxide semiconductor device according to a first exemplary embodiment of a second embodiment of the invention.
Figure 2B:
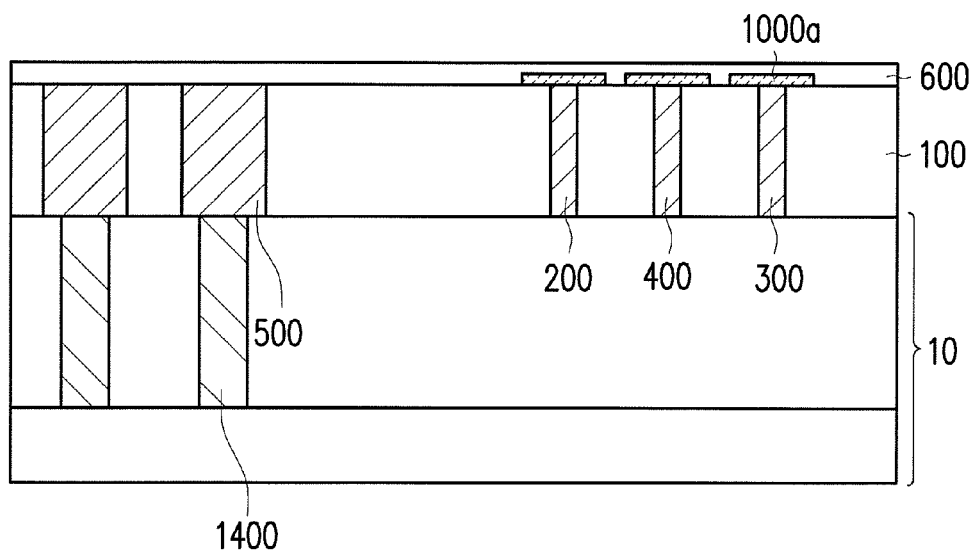
Figure 2C:
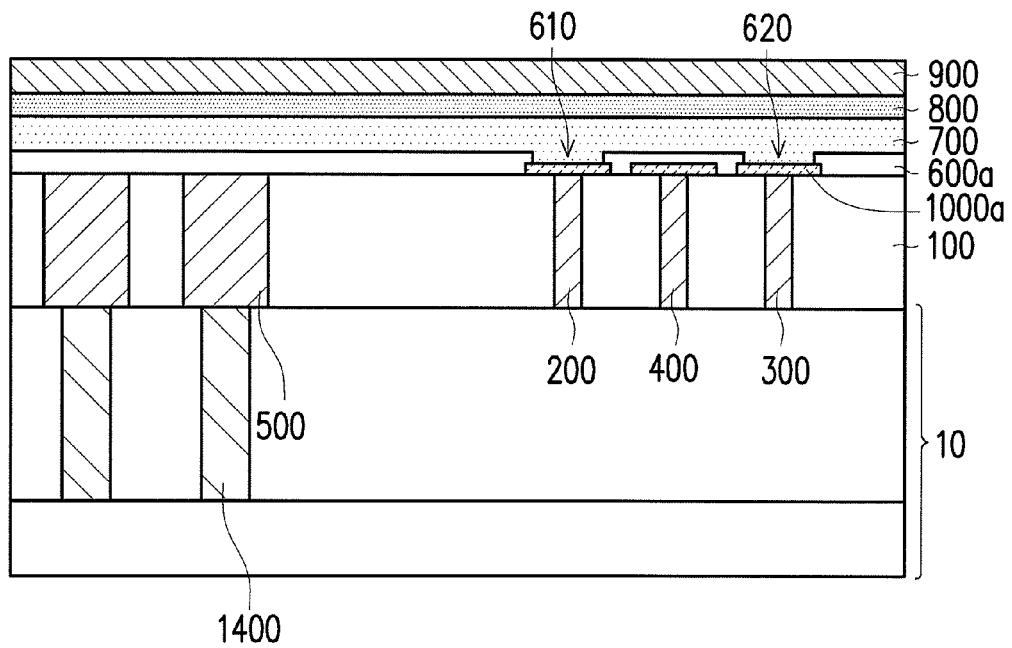
Figure 2D:
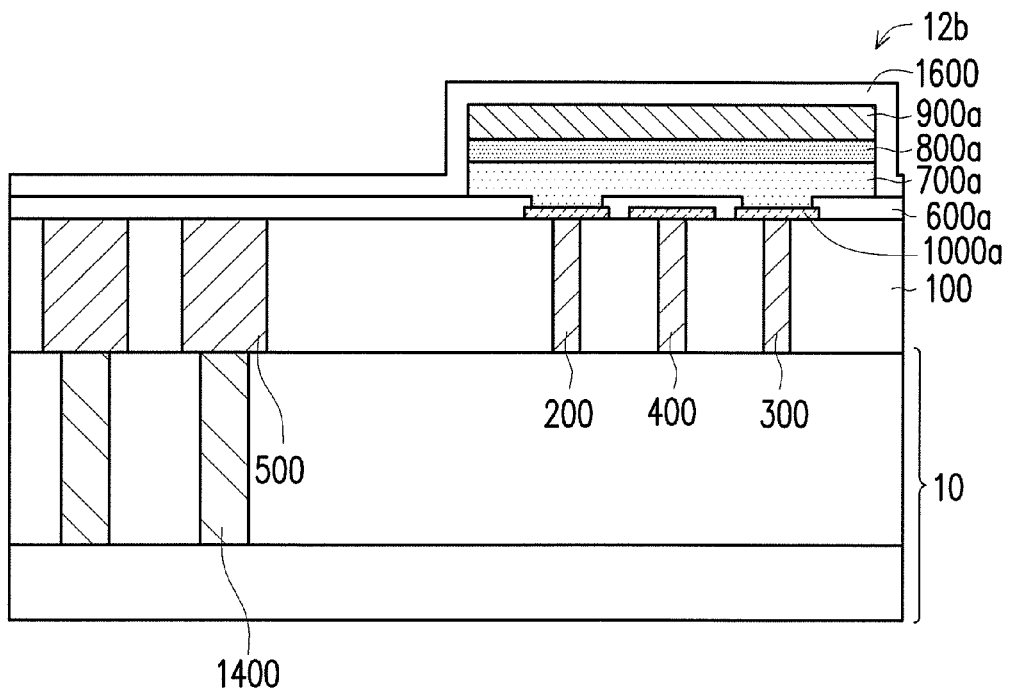

FIG. 2A to FIG. 2E are schematic cross-sectional views illustrating a method of fabricating an oxide semiconductor device according to a first exemplary embodiment of a second embodiment of the invention. FIG. 2F is a schematic cross-sectional view illustrating an oxide semiconductor device according to a second exemplary embodiment of the second embodiment of the invention. FIG. 2G is a schematic cross-sectional view illustrating an oxide semiconductor device according to a third exemplary embodiment of the second embodiment of the invention.

Figure 2E:
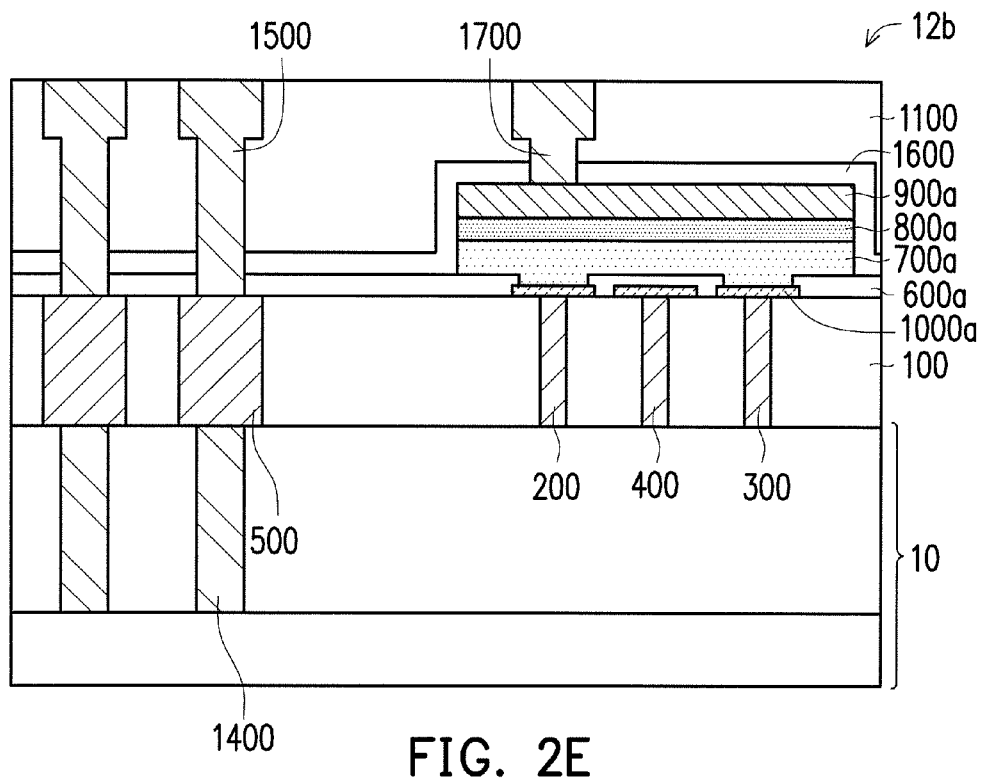
Figure 2F:
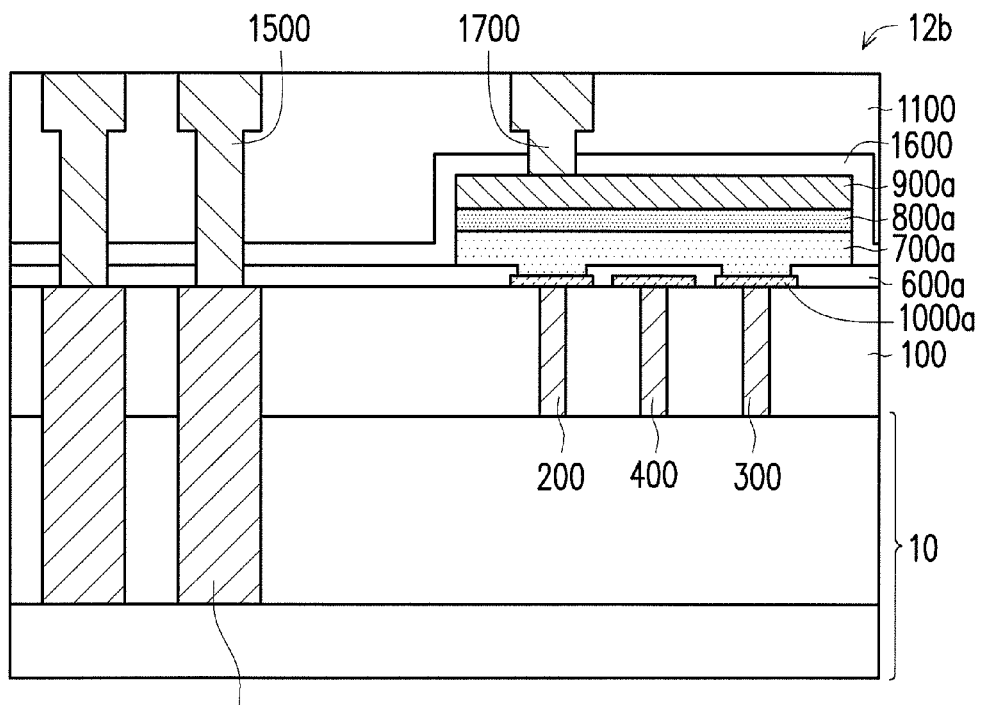
FIG. 2F is a schematic cross-sectional view illustrating an oxide semiconductor device according to a second exemplary embodiment of the second embodiment of the invention.
Figure 2G:
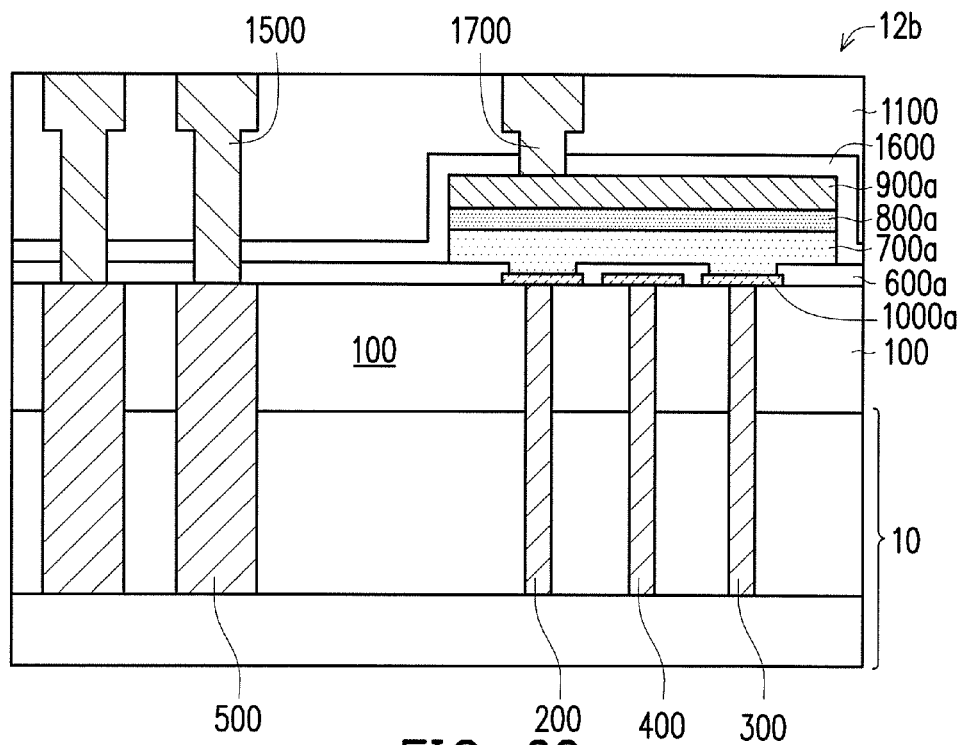
FIG. 2G is a schematic cross-sectional view illustrating an oxide semiconductor device according to a third exemplary embodiment of the second embodiment of the invention.

Referring to FIG. 2E, FIG. 2F, and FIG. 2G, a structure of an oxide semiconductor device 12b of the second embodiment is similar to the structure of the oxide semiconductor device 12a in FIG. 1E, FIG. 1F, and FIG. 1G. The difference therebetween is that the second embodiment further includes a third barrier layer 1000a. The third barrier layer 1000a covers the source 200, the drain 300, and the first gate 400. In other words, the third barrier layer 1000a is located between the oxide semiconductor layer 700a and the source 200 and located between the oxide semiconductor layer 700a and the drain 300. The similar and the related process of the second embodiment compared to the first embodiment will not be described in the following specification.

Referring to FIG. 2A to FIG. 2D, in some embodiments, the third barrier layer 1000a as shown in FIG. 2E, FIG. 2F, and FIG. 2G may be formed before the first barrier material layer 600 is formed. More specifically, a method of forming the third barrier layer 1000a may be forming a third barrier material layer 1000 on the first dielectric layer 100, the source 200, the drain 300, the first gate 400, and the conductive structures 500 first. Then, the third barrier material layer 1000 is patterned, so as to form the third barrier layer 1000a only covering the source 200, the drain 300, the first gate 400, and parts of the first dielectric layer 100. A method of patterning the third barrier material layer 1000 is a lithography process and an etching process, for example. A material of third barrier layer 1000a includes TiN or W. The third barrier layer 1000a may further protect the oxide semiconductor device 700a to not be subjected the effects from gases from environment, such as $H_2O$ or $H_2$.

Figure 3A:
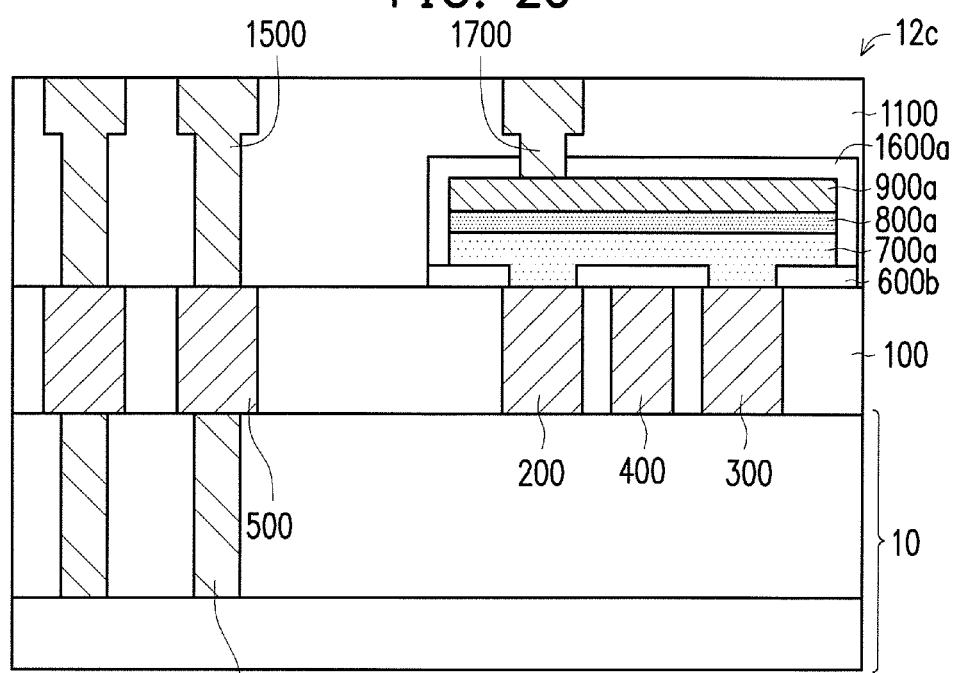
FIG. 3A is a schematic cross-sectional view illustrating an oxide semiconductor device according to a first exemplary embodiment of the third embodiment of the invention.
Figure 3B:
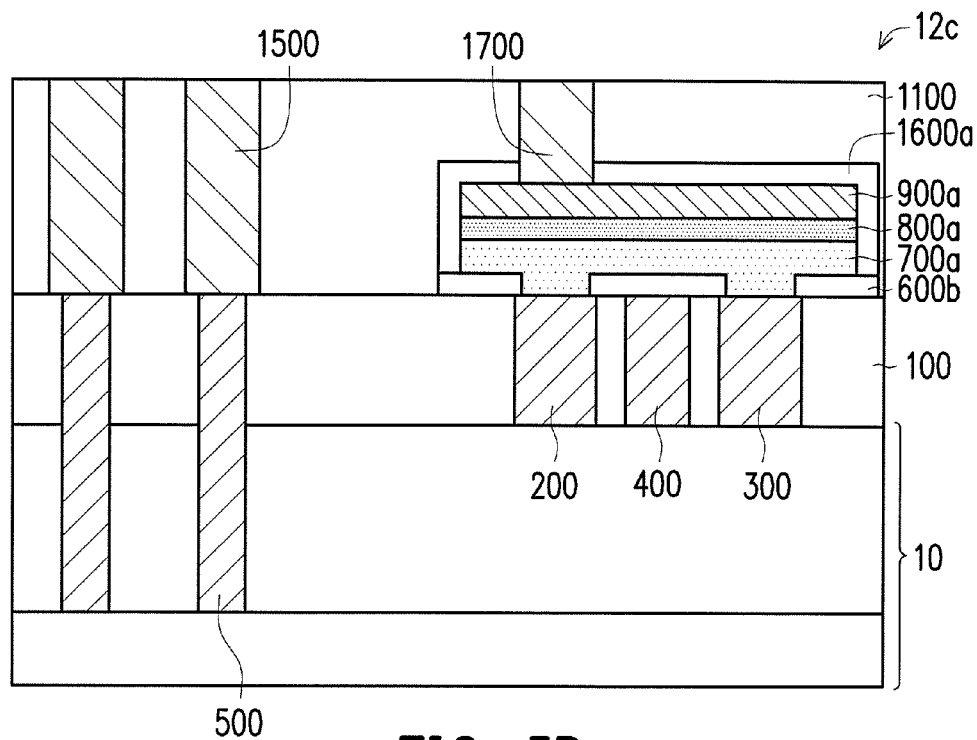
FIG. 3B is a schematic cross-sectional view illustrating an oxide semiconductor device according to a second exemplary embodiment of the third embodiment of the invention.
Figure 3C:
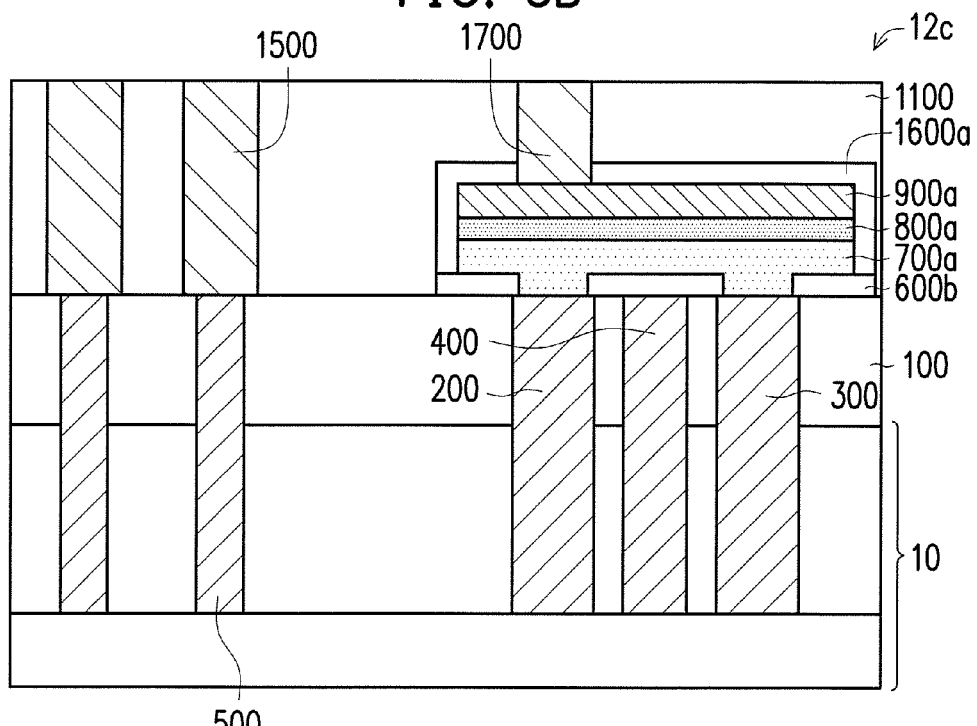
FIG. 3C is a schematic cross-sectional view illustrating an oxide semiconductor device according to a third exemplary embodiment of the third embodiment of the invention.

FIG. 3A is a schematic cross-sectional view illustrating an oxide semiconductor device according to a first exemplary embodiment of the third embodiment of the invention. FIG. 3B is a schematic cross-sectional view illustrating an oxide semiconductor device according to a second exemplary embodiment of the third embodiment of the invention. FIG. 3C is a schematic cross-sectional view illustrating an oxide semiconductor device according to a third exemplary embodiment of the third embodiment of the invention.

Referring to FIG. 3A, FIG. 3B, and FIG. 3C, a structure of an oxide semiconductor device 12c of the third embodiment is similar to the structure of the oxide semiconductor device 12a in FIG. 1E, FIG. 1F, and FIG. 1G. A difference therebetween is that the fourth barrier layer 1600a covers a top surface and sidewalls of the second gate 900a, and sidewalls of the second barrier layer 800a and the oxide semiconductor layer 700a, and the first barrier layer 600b is only located under the second gate 900a and the fourth barrier layer 1600a. A part of the first dielectric layer 100 is not covered by the second gate 900a and is not covered by the fourth barrier layer 1600a and the first barrier layer 600b. A method of forming the first barrier layer 600b and the fourth barrier layer 1600a may be used various known processes. Referring to FIG. 1D, in an embodiment, after the fourth barrier layer 1600 is formed, the fourth barrier layer 1600 and the first barrier layer 600a are patterned by a lithography process and an etching process, so as to form the fourth barrier layer 1600a and the first barrier layer 600b as shown in FIG. 3A.

Figure 4A:
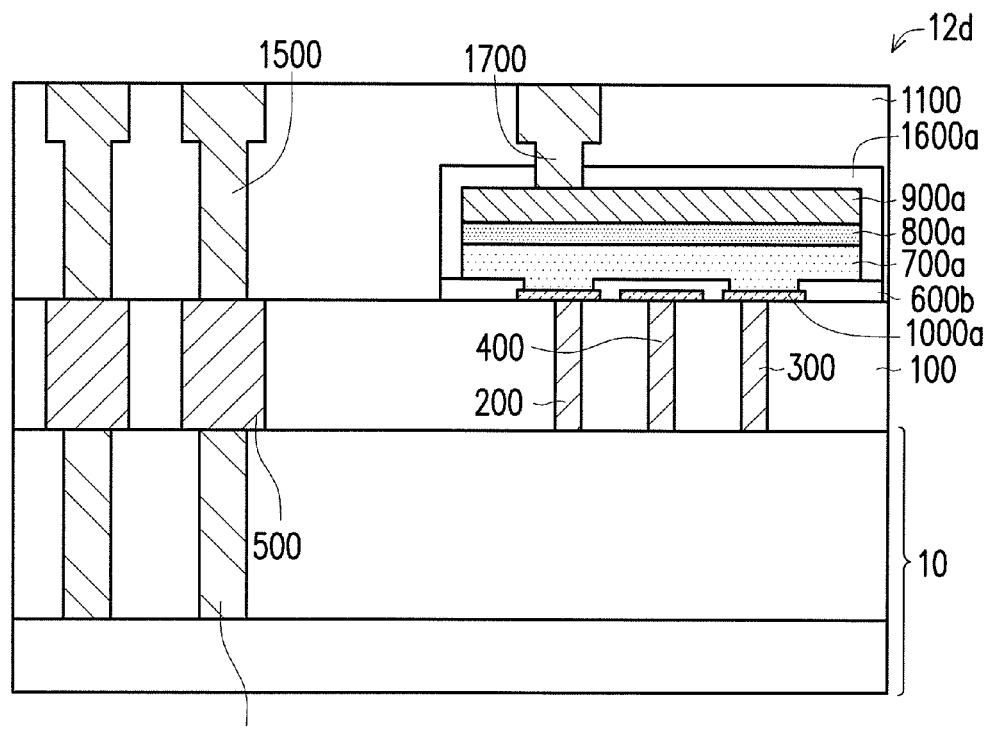
FIG. 4A is a schematic cross-sectional view illustrating an oxide semiconductor device according to a first exemplary embodiment of the fourth embodiment of the invention.
Figure 4B:
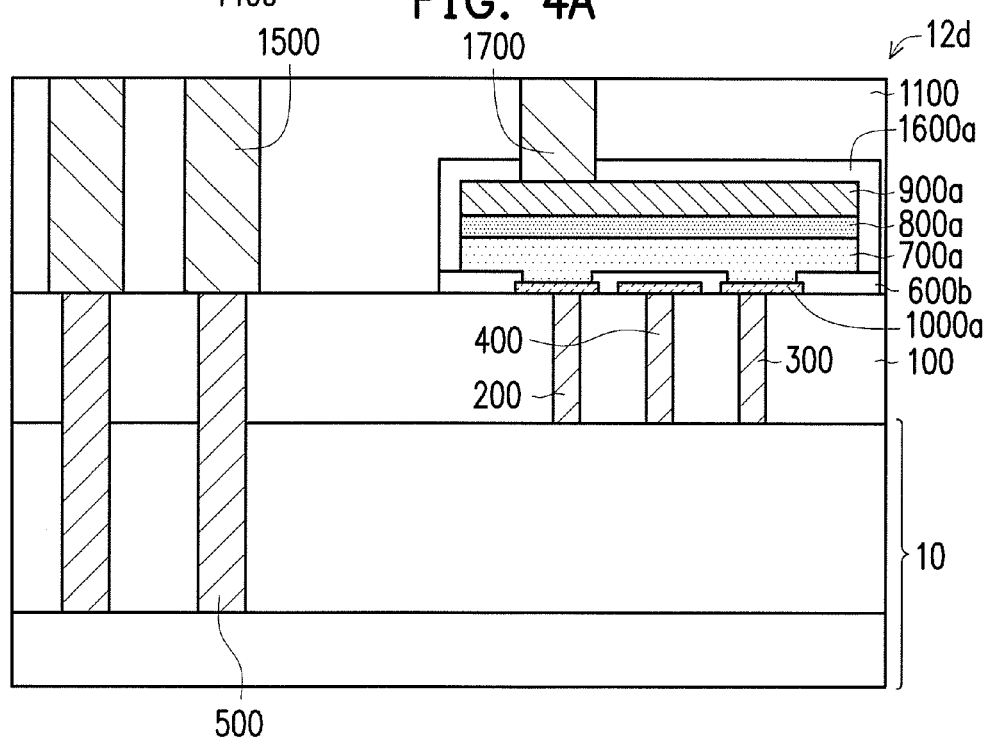
FIG. 4B is a schematic cross-sectional view illustrating an oxide semiconductor device according to a second exemplary embodiment of the fourth embodiment of the invention.
Figure 4C:
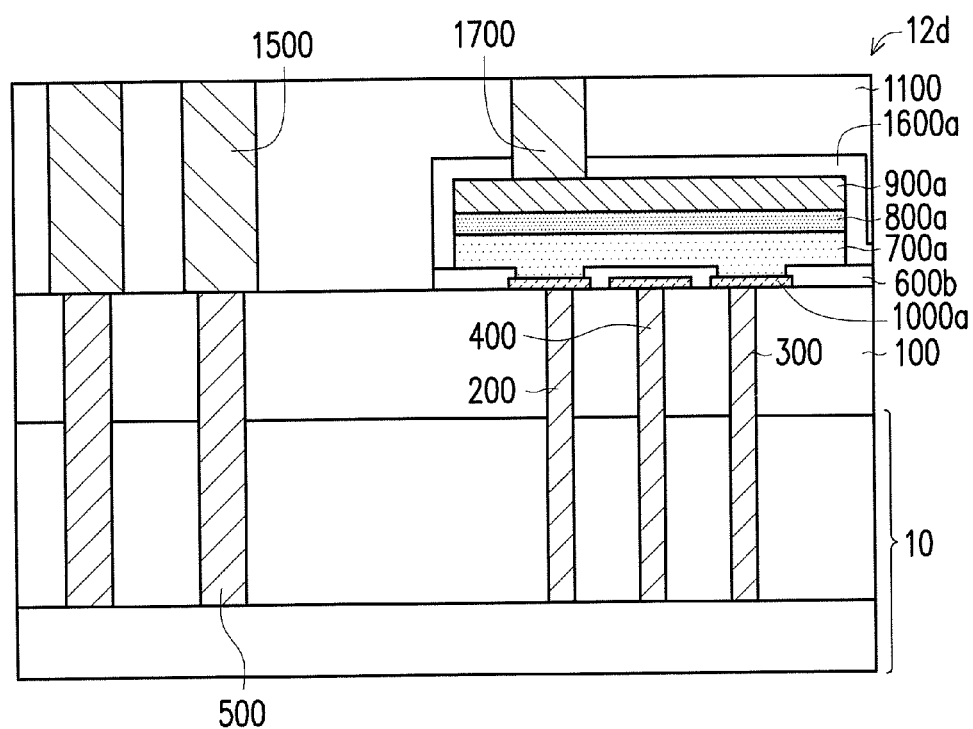
FIG. 4C is a schematic cross-sectional view illustrating an oxide semiconductor device according to a third exemplary embodiment of the fourth embodiment of the invention.

FIG. 4A is a schematic cross-sectional view illustrating an oxide semiconductor device according to a first exemplary embodiment of the fourth embodiment of the invention. FIG. 4B is a schematic cross-sectional view illustrating an oxide semiconductor device according to a second exemplary embodiment of the fourth embodiment of the invention. FIG. 4C is a schematic cross-sectional view illustrating an oxide semiconductor device according to a third exemplary embodiment of the fourth embodiment of the invention.

Referring to FIG. 4A, FIG. 4B, and FIG. 4C, a structure of an oxide semiconductor device 12d of the fourth embodiment is similar to the structure of the oxide semiconductor device 12b in FIG. 2E, FIG. 2F, and FIG. 2G. A difference therebetween is that the fourth barrier layer 1600a of the fourth embodiment covers a top surface and sidewalls of the second gate 900a, and sidewalls of the second barrier layer 800a and the oxide semiconductor layer 700a, and the first barrier layer 600a is only located under the second gate 900a and the fourth barrier layer 1600a. A part of the first dielectric layer 100 is not covered by the second gate 900a and is not covered by the fourth barrier layer 1600a and the first barrier layer 600b. A method of forming the first barrier layer 600b and the fourth barrier layer 1600a may be used various known processes. Referring to FIG. 2D, in an embodiment, after the fourth barrier layer 1600 is formed, the fourth barrier layer 1600 and the first barrier layer 600a are patterned by a lithography process and an etching process, so as to form the fourth barrier layer 1600a and the first barrier layer 600b as shown in FIG. 4A, FIG. 4B, and FIG. 4C.

FIG. 5A to FIG. 5G are schematic cross-sectional views illustrating a method of fabricating an oxide semiconductor device according to a fifth embodiment of the invention.

Figure 5A:
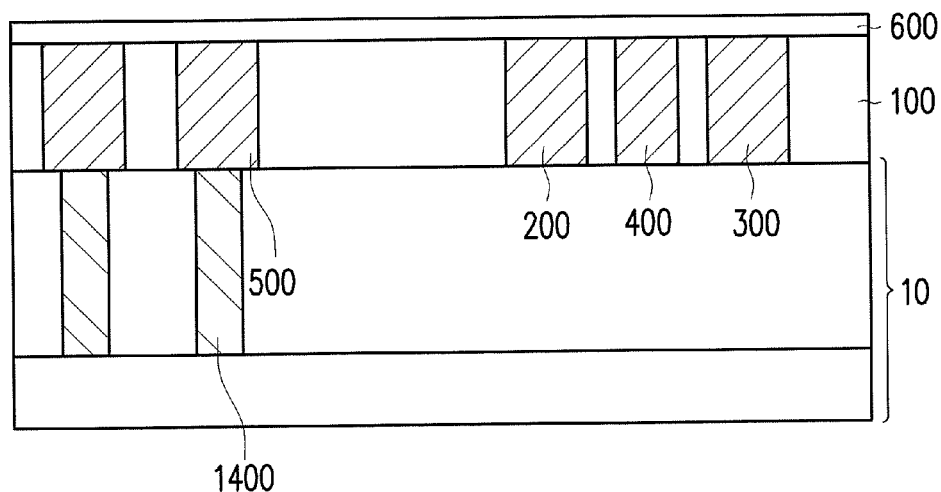
FIG. 5A to FIG. 5G are schematic cross-sectional views illustrating a method of fabricating an oxide semiconductor device according to a fifth embodiment of the invention.
Figure 5B:
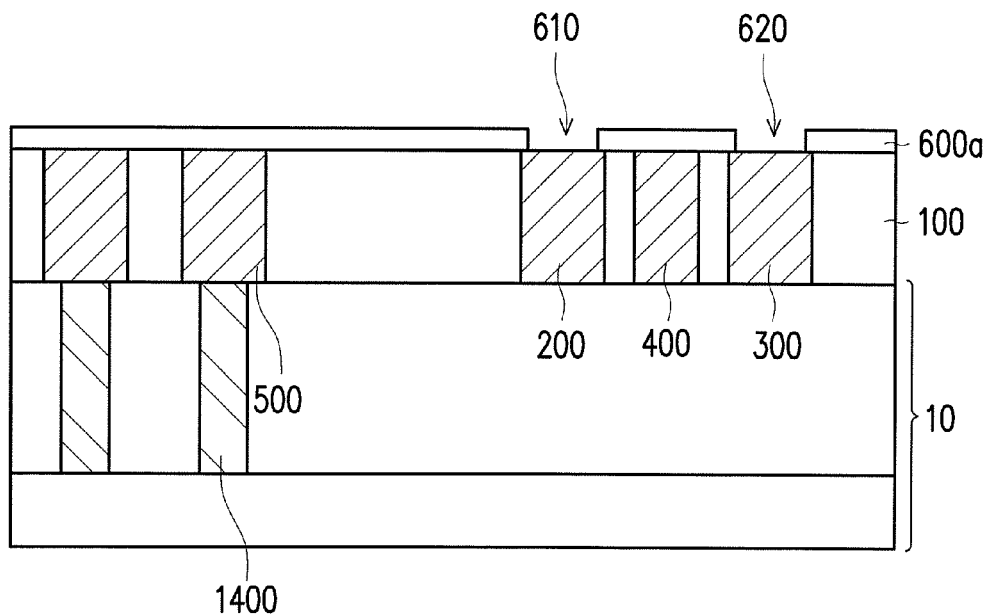
Figure 5C:
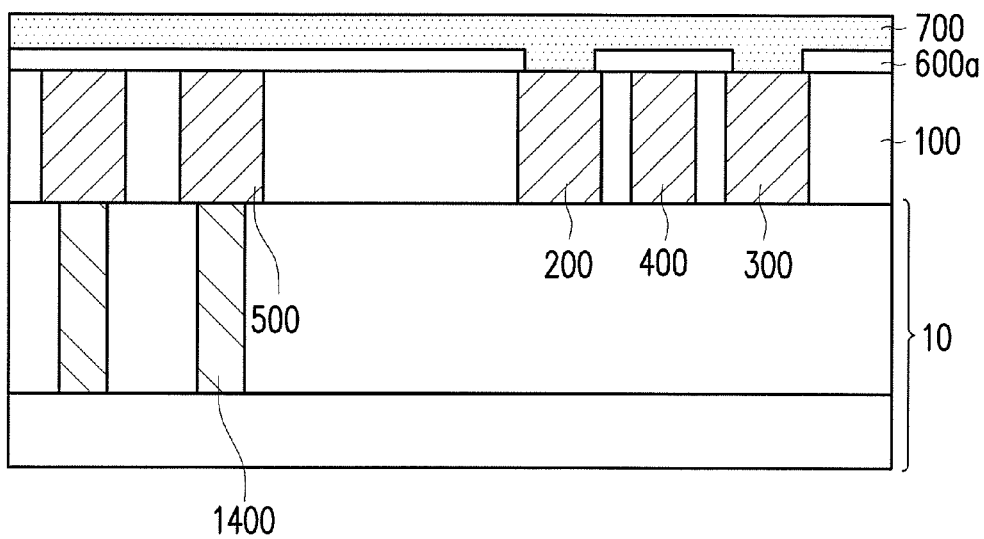
Figure 5D:
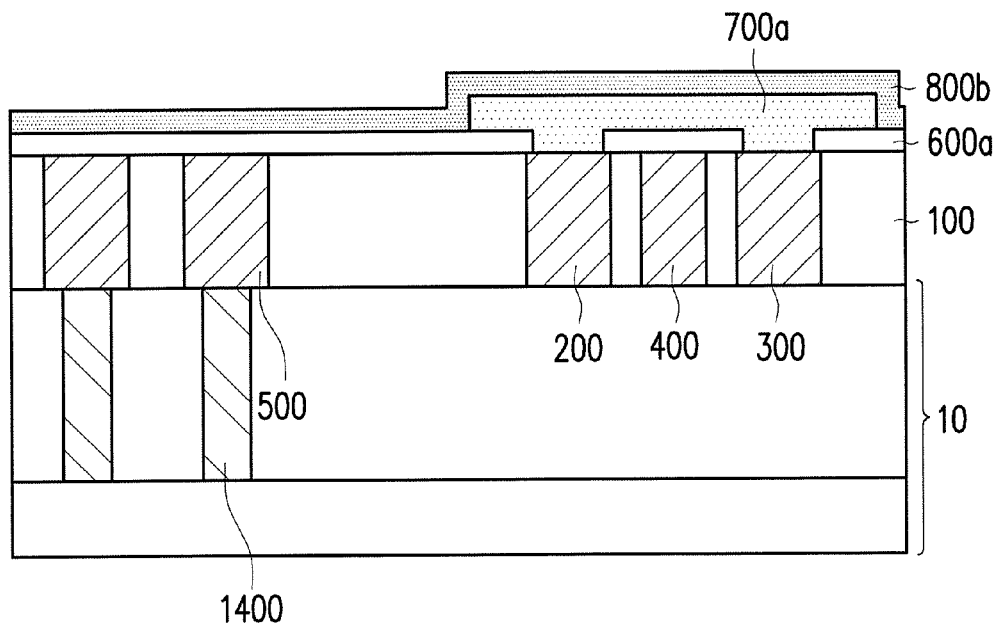
Figure 5E:
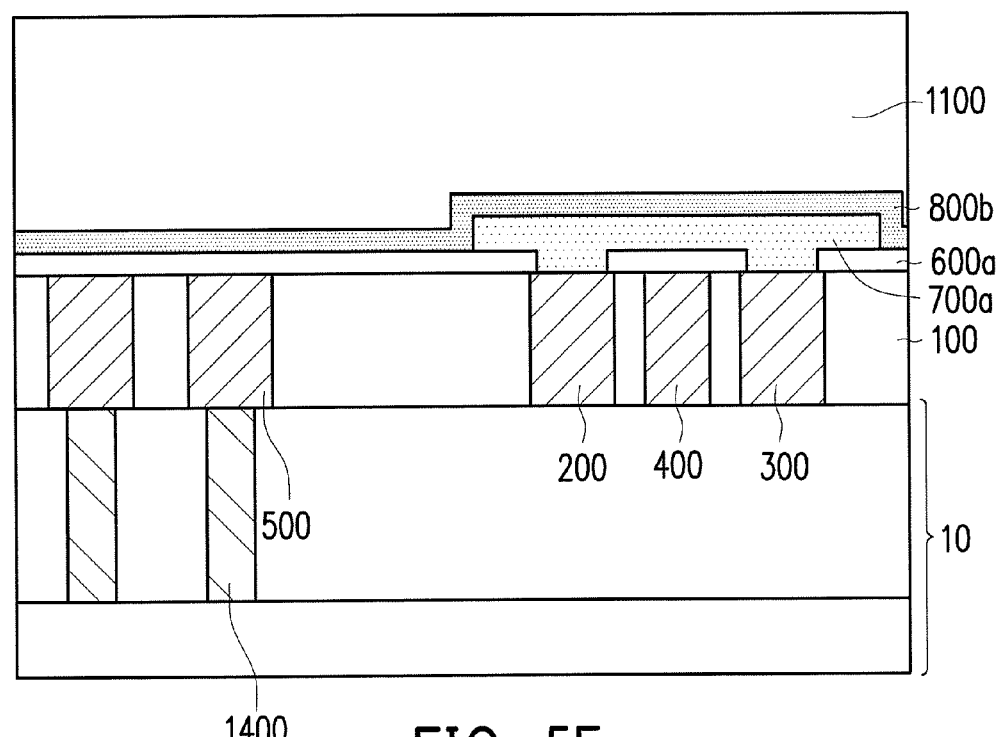
Figure 5F:
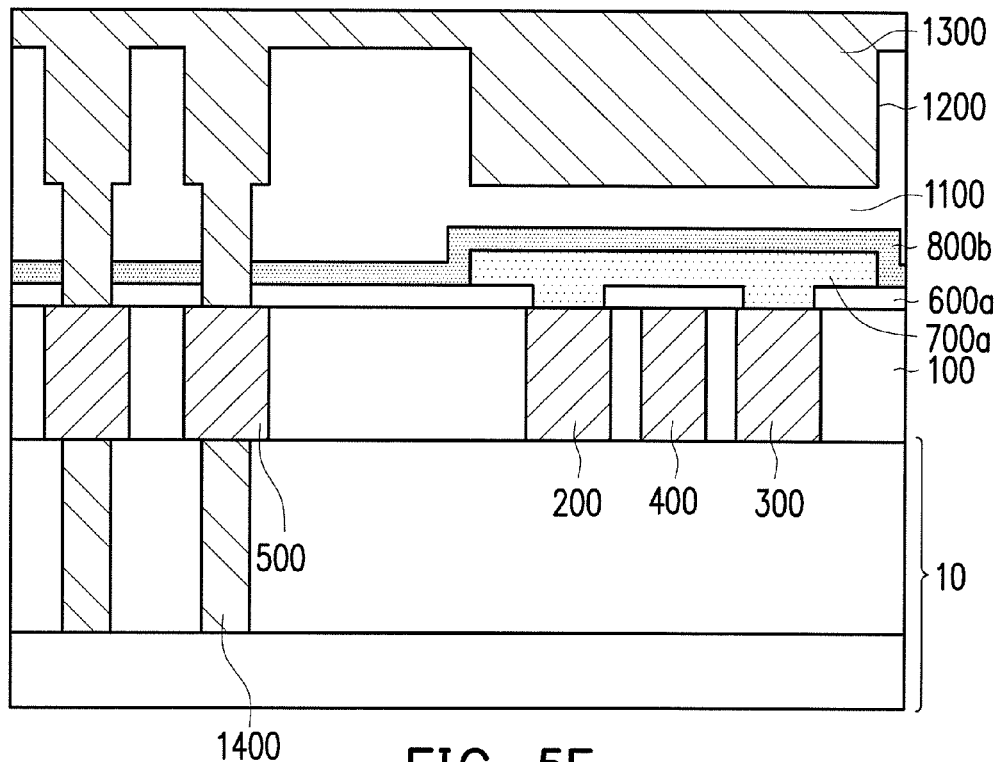
Figure 5G:
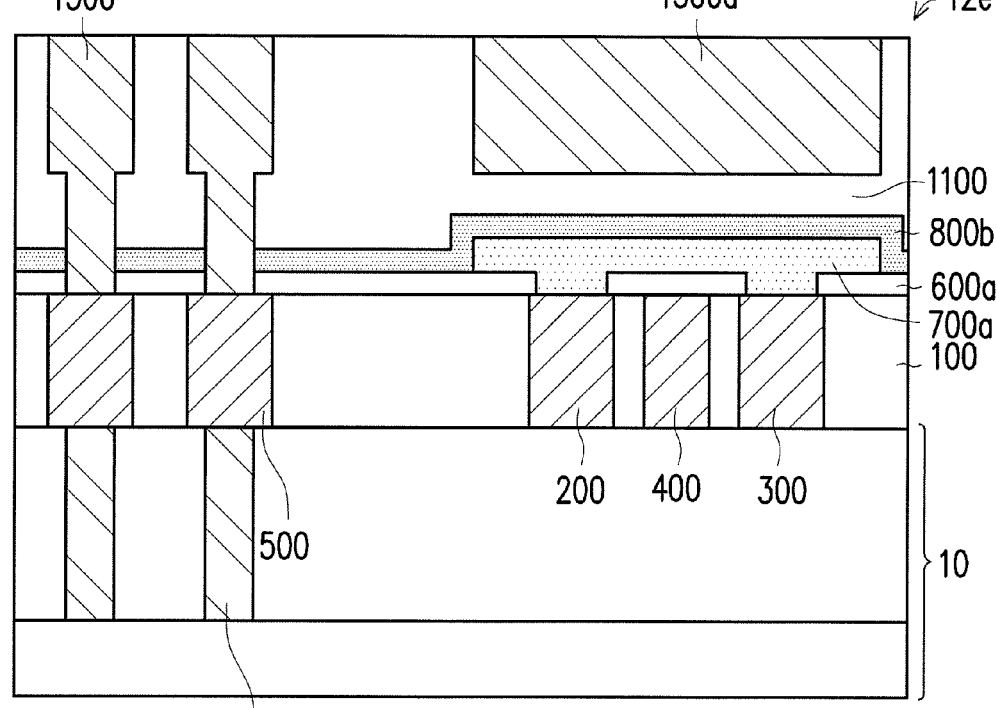

Referring to FIG. 5G, a structure of an oxide semiconductor device 12e of the fifth embodiment is different from the structure of the oxide semiconductor device 12a in FIG. 1C that the second barrier layer 800b of the fifth embodiment not only covers a top surface of the oxide semiconductor layer 700a, but also covers sidewalls of the oxide semiconductor layer 700a. Besides, in some embodiments, the second gate 900a of the oxide semiconductor device 12e of the third embodiment is located on the second dielectric layer 1100. The difference will be illustrated in detail in the following while the identity will not be described.

Referring to FIG. 5B to FIG. 5D, after the oxide semiconductor material layer 700 is formed on the first barrier layer 600a and in the first opening 610 and the second opening 620, a lithography process and an etching process is performed first to pattern the oxide semiconductor material layer 700, so as to form the oxide semiconductor layer 700a. After that, a second barrier layer 800 is formed on the substrate 10. The second barrier layer 800 covers the first barrier layer 600a and covers a top surface and sidewalls of the oxide semiconductor layer 700a.

Next, referring to FIG. 5G, a second dielectric layer 1100, a second gate 1300a, and the metal interconnection 1500 are formed on the second barrier layer 800b. The second dielectric layer 1100 may be an inter-metal dielectric layer. The second dielectric layer 1100 may be formed of an organic material, an inorganic material, or a combination thereof. A material of the second dielectric layer 1100 is silicon oxide, silicon nitride, silicon oxynitride, un-doped silicon glass (USG), borophosphosilicate glass (BPSG), phosphosilicate glass (PSG), a low dielectric constant material, and a combination thereof, for example. A thickness of the second dielectric layer 1100 is from 5 nm to 50 nm, for example. A material of the second gate 1300a and the metal interconnection 1500 includes TiN, TaN, W, Al, Ti, other conductive materials, or a combination thereof.

The second dielectric layer 110, the second gate 1300a, and the metal interconnection 1500 may be formed using the known processes. Referring to FIG. 5E to FIG. 5G, in an embodiment, the second dielectric layer 1100 may be formed on the second barrier layer 800b first. After that, a plurality of openings 1200 is formed in the second dielectric layer 1100. Then, a conductive material layer 1300 is filled in the openings 1200. A material of the conductive material layer 1300 includes TiN, TaN, W, Al, Ti, other conductive materials, or a combination thereof. A thickness is from 100 nm to 500 nm, for example. A method of forming the conductive material layer 1300 includes PVD or CVD. After that, a chemical mechanical polishing process or an etching-back process was performed to remove the conductive material 1300 on the second dielectric layer 1100, so as to form the second gate 1300a and the metal interconnection 1500. In the embodiment, the conductive structured 500 may be the Mth metal layer, and the metal interconnection 1500 may be the (M+1)th metal layer. The source 200, the drain 300, the first gate 400 may be formed simultaneously when the Mth metal layer is formed. The second gate 1300a of the oxide semiconductor device 12e may be formed simultaneously when the (M+1)th metal layer is formed.

Referring to FIG. 5G, in the fifth embodiment, the oxide semiconductor device 12e includes the source 200, the drain 300, the first gate 400, the first barrier layer 600a, the oxide semiconductor layer 700a, the second barrier layer 800b, the second dielectric layer 1100, and the second gate 1300a. The source 200, the drain 300, and the first gate 400 are buried in the first dielectric layer 100. The first gate 400 is located between the source 200 and the drain 300. The first barrier layer 600a is located on the first dielectric layer 100 and partially overlaps the source 200 and the drain 300, and overlaps the first gate 400. The first barrier layer 600a has the first opening 610 and the second opening 620 corresponding to the source 200 and the drain 300 respectively. The oxide semiconductor layer 700a covers the first barrier layer 600a and fills in the first opening 610 and the second opening 620. The second barrier layer 800b is located on a top surface of the oxide semiconductor layer 700a and covers sidewalls thereof. The second dielectric layer 1100 is located on the second barrier layer 800b. The second gate 1300a is located on the second dielectric layer 1100.

In summary, in some embodiments of the invention, since the source, the drain, and the first gate are formed simultaneously, and the oxide semiconductor layer is formed only once, the method may reduce the steps of the process and improve the critical dimension of the device. Besides, since the first barrier layer (gate dielectric layer) is thin, and a depth of the openings is shallow famed by patterning, such that the oxide semiconductor layer forming subsequently is easily to be filled in the openings to improve the performance of the device. Otherwise, in some other embodiments of the invention, the oxide semiconductor device may also be integrated with the semiconductor process in existence.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An oxide semiconductor device, comprising:
    a source, a drain, and a first gate buried in a first dielectric layer, wherein the first gate is located between the source and the drain;
    a first barrier layer located on the first dielectric layer, partially overlapping the source and the drain and overlapping the first gate, and the first barrier layer comprising a first opening and a second opening respectively corresponding to the source and the drain;
    an oxide semiconductor layer covering the first barrier layer and filling in the first opening and the second opening;
    a second barrier layer located on the oxide semiconductor layer; and
    a second gate located on the second barrier layer and overlapping the source, the drain, and the first gate.

2. The oxide semiconductor device according to claim 1, wherein the source is contacted with the oxide semiconductor layer, and the drain is contacted with the oxide semiconductor layer.

3. The oxide semiconductor device according to claim 1, further comprising a third barrier layer located between the source and the oxide semiconductor layer and between the drain and the oxide semiconductor layer.

4. The oxide semiconductor device according to claim 1, wherein the second barrier layer further covers sidewalls of the oxide semiconductor layer.

5. The oxide semiconductor device according to claim 4, further comprising a second dielectric layer located between the second gate and the second barrier layer.

6. The oxide semiconductor device according to claim 5, wherein the first dielectric layer is an inner-layer dielectric layer; the second dielectric layer is an inter-metal dielectric layer.

7. The oxide semiconductor device according to claim 5, wherein the first dielectric layer is an inter-metal dielectric layer; the second dielectric layer is another one inter-metal dielectric layer.

8. The oxide semiconductor device according to claim 1, wherein the first dielectric layer is an inner-layer dielectric layer or an inter-metal dielectric layer.

9. The oxide semiconductor device according to claim 1, further comprising a fourth barrier layer covering a top surface and sidewalls of the second gate, and sidewalls of the second barrier layer and the oxide semiconductor layer.

10. The oxide semiconductor device according to claim 1, wherein a height of the source, a height of the drain, and a height of the first gate are the same.

11. A method of fabricating an oxide semiconductor device comprising:
    burying a source, a drain, and a first gate in a first dielectric layer, wherein the first gate is located between the source and the drain;
    forming a first barrier material layer covering the first dielectric layer, the source, the drain, and the first gate;
    patterning the first barrier material layer, so as to form a first barrier layer, and the first barrier layer comprising a first opening and a second opening respectively corresponding to the source and the drain;
    forming an oxide semiconductor layer covering the first barrier layer and filling in the first opening and the second opening;
    forming a second barrier layer on the oxide semiconductor layer; and
    forming a second gate on the second barrier layer, and the second gate overlapping the source, the drain, and the first gate.

12. The method of fabricating the oxide semiconductor device according to claim 11, comprising:

forming an oxide semiconductor material layer on the first barrier layer and filling in the first opening and the second opening;
forming a second barrier material layer on the oxide semiconductor material layer;
forming a conductive material layer on the second barrier material layer; and
patterning the conductive material layer, the second barrier material layer, and the oxide semiconductor material layer, so as to form the second gate, the second barrier layer, and the oxide semiconductor layer.

13. The method of fabricating the oxide semiconductor device according to claim 12, further comprising forming a third barrier layer covering the source, the drain, and the first gate after burying the source, the drain, and the first gate in the first dielectric layer and before forming the first barrier layer.

14. The method of fabricating the oxide semiconductor device according to claim 11, comprising:
forming an oxide semiconductor material layer on the first barrier layer and filling in the first opening and the second opening;
patterning the oxide semiconductor material layer, so as to form the oxide semiconductor layer;
forming the second barrier layer, wherein the second barrier layer covers the oxide semiconductor layer and the first barrier layer;
forming a second dielectric layer to cover the second barrier layer;
forming a plurality of openings in the second dielectric layer;
forming a conductive material layer on the second barrier layer and filling in the openings; and
removing the conductive material layer on the second dielectric layer, so as to form the second gate.

15. The method of fabricating the oxide semiconductor device according to claim 11, wherein the source, the drain, and the first gate are formed simultaneously.

16. The method of fabricating the oxide semiconductor device according to claim 11, further comprising rounding top edge corners of the first opening and the second opening.

17. The method of fabricating the oxide semiconductor device according to claim 11, wherein an aspect ratio of the first opening and the second opening is less than 1.

18. The method of fabricating the oxide semiconductor device according to claim 11, wherein a material of the first barrier layer and a material of the second barrier layer respectively comprising hafnium aluminum oxide, aluminum oxide ($Al_2O_3$), hafnium oxide ($HfO_2$), silicon nitride, zirconium oxide ($ZrO_x$), silicon oxide ($SiO_x$), or a combination thereof.

19. The method of fabricating the oxide semiconductor device according to claim 11, wherein a material of the oxide semiconductor layer comprising IGZO, ZnO, CdO, $SnO_2$, $In_2O_3$, $TiO_2$, SnO, $Cu_2O$, NiO, CoO, $FeO_x$, $Cr_2O_3$, or a combination thereof.

20. The method of fabricating the oxide semiconductor device according to claim 11, wherein the first dielectric layer is an inner-layer dielectric layer or an inter-metal dielectric layer.

* * * * *